United States Patent [19]

Wingender

[11] Patent Number: 5,444,447
[45] Date of Patent: Aug. 22, 1995

[54] ANALOG-DIGITAL CONVERTER WITH DISTRIBUTED SAMPLE-AND-HOLD CIRCUIT

[75] Inventor: Marc Wingender, Grenoble, France

[73] Assignee: Thomson-CSF Semiconducteurs Specifiques, Paris, France

[21] Appl. No.: 174,419

[22] Filed: Dec. 28, 1993

[30] Foreign Application Priority Data

Dec. 30, 1992 [FR] France ................. 92 15906

[51] Int. Cl.⁶ ............................................. H03M 1/14
[52] U.S. Cl. ....................................... 341/156; 341/159
[58] Field of Search ......................... 341/156, 159, 161

[56] References Cited

U.S. PATENT DOCUMENTS

| | | |
|---|---|---|
| 3,710,377 | 1/1973 | Guillen et al. |
| 4,229,729 | 10/1980 | Devendorf et al. ............... 341/159 |
| 4,928,103 | 5/1990 | Lane ................................. 341/159 |
| 5,117,227 | 5/1992 | Goeke .............................. 341/166 |
| 5,157,398 | 10/1992 | Okazaki et al. |
| 5,159,342 | 10/1992 | Yotsuyanagi .................... 341/161 |
| 5,274,377 | 12/1993 | Matsuura et al. ................ 341/161 |
| 5,321,402 | 6/1994 | Matsuzawa et al. ............. 341/161 |

FOREIGN PATENT DOCUMENTS

0414389 2/1991 European Pat. Off. .
0474567A1 3/1992 European Pat. Off. .

OTHER PUBLICATIONS

I.E.E.E. Journal of Solid-State Circuits vol. SC-22, No. 6, Dec. 1987 New York pp. 944–953.
Electronic Components & Applications vol. 8, No 3, 1988 Eindhoven, The Netherlands pp. 171–174.

*Primary Examiner*—Marc S. Hoff
*Attorney, Agent, or Firm*—Oblon, Spivak, McClelland, Maier & Neustadt

[57] ABSTRACT

The disclosure relates to analog-digital converters. It is sought to limit the power consumption and obtain a better compromise among the different performance characteristics of the computer. In a general structure of a converter there are, firstly, a coarse converter for the most significant bits and, secondly, a fine converter for the least significant bits. One of them, generally, the fine converter, has differential amplifiers [AD(1) to AD(N)]receiving the voltage to be converted (Ve) and a reference voltage. It is proposed to place sample-and-hold circuits [EB(1) to EB(N)] at output of these differential amplifiers and to eliminate the sample-and-hold circuit that is often placed upline with respect to these amplifiers.

9 Claims, 2 Drawing Sheets

ANALOG-DIGITAL CONVERTER WITH DISTRIBUTED SAMPLE-AND-HOLD CIRCUIT

BACKGROUND OF THE INVENTION

1. Field of the Invention

The invention relates to analog-digital converters, namely electronic circuits that can be used to convert an analog input signal into a precise digital value representing the amplitude of the analog signal. The digital value is obtained in the form of a word of several bits, generally encoded in pure binary mode.

Several conversion methods exist and the choice of one method rather than another depends on the performance characteristics expected of the converter. The most important parameters of these performance characteristics are:

- the resolution defined by the number of bits of the output mode representing the amplitude of the analog signal with exactness; the number of bits may from 16 to 18, or even 20, for the most precise converters, and the precision is generally within plus or minus ½ the least significant bit.;
- the speed, namely the number of conversion operations that can be done in one second;
- the power consumption: a fast and precise converter consumes far more energy than a slow, low-precision converter; now the consumption of power leads to a heating of the integrated circuit chip on which the converter is made. This heating should be compensated for by cooling means that make it hard to use the circuit when there are space requirement constraints to be met;
- and of course the cost of designing and manufacturing the converter, related especially to the integrated circuit chip surface used by the converter.

The qualities of an analog-digital converter result from a compromise among the above parameters and an aim of the present invention is to obtain a better compromise of this kind.

2. Description of the Prior Art

The known structures of analog-digital converters include:

- successive approximation converters that compare the input analog signal Vin successively with digital values that, at each time, approach the value of the analog signal more closely; these converters work in at least N phases if the value is encoded on N bits. They are generally very slow for values of precision exceeding 6 or 8 bits.
- flash converters which use $2^N$ comparators in parallel; the comparators each receive, firstly, the analog signal and, secondly, one of $2^N$ reference voltages defined by a bridge of $2^N$ precision resistors; these converters are very fast (generally two phases) but they are very bulky and consume a great deal of power when N reaches 10 to 12 bits;
- combined converters which have a coarse converter to obtain most significant bits and a fine converter to obtain least significant bits; the coarse converter may be a high-speed and low-precision converter (with a precision of 4 to 6 bits for example); the fine converter must be precise even when it is less speedy.

Among the combined converters, several approaches have already been proposed.

In one approach, the coarse converter is a flash converter that gives P bits which are the most significant bits. This value is reconverted into an analog signal by a P bit digital-analog converter. The difference between the analog signal Vin and this reconverted value, also called a remainder or residue, is converted by a fine converter which determines the least significant bits of the conversion. There is a gain in power consumption and space requirement as compared with a flash converter, but the digital-analog conversion takes time and calls for a precise servocontrol of the gains of the different circuit parts (the analog-digital and digital-analog converters).

Another architecture of a combined converter uses what is known as an input analog signal folding converter. The input signal Vin is applied to at least two folding circuits with the function of giving signals called "folded" signals Vr1, Vr1b, Vr2, Vr2b having an amplitude that varies with the amplitude of the input signal Vin according to a periodic function (having an approximately sinusoidal shape). The differences (Vr1−Vr1b), (Vr2−Vr2b) between the folded signals coming from two blocks get nullified periodically for input voltage values that are reference voltages defined by a bridge of resistors. On the basis of these differences, signals called "interpolated" signals are set up. These interpolated signals have the same general form as the differences of folded signals, but get nullified for the intermediate input voltage values between the reference values.

The interpolated signals can then be used to obtain the least significant bits of the digital-analog conversion, representing the position of Vin with respect to these intermediate reference values. The most significant bits are given by a coarse converter that indicates the "period" of the folded signals in which the analog input voltage Vin is located, i.e. it indicates the adjacent values of reference voltages in between which Vin is located.

In a previously proposed architecture, the interpolation circuit comprises simple bridges of resistors that receive, for example, the differences (Vr1−Vr2) and (Vr1b−Vr2b) between the folded signals. The intermediate connections of these bridges of resistors give the interpolated signals; they are applied two by two to comparators that switch over in one direction or the other according to the value of the interpolated signals, hence according to the position of Vin between two adjacent reference voltages.

In another architecture, the interpolation circuit comprises several cascaded stages. The first stage receives the four folded signals and combines them so as to produce four other signals which are again periodic functions of the input analog voltage Vin but, this time, with a period that is double the period of the folded signals: these two signals pass through zero not only when Vin is equal to the reference voltages that have been used for the folding but also for intermediate reference voltages located in the middle of the interval between two adjacent reference voltages. The signals can therefore be used to give an additional information bit with respect to the most significant bits obtained by the coarse converter. The voltages thus obtained at output of the first stage are applied to a second stage which has the same function (the creation of signals with a period that is again doubled) and gives an additional bit for the value of Vin. Continuing in this way, several stages may be cascade-connected to obtain the successive least significant bits of the conversion. It seems that the U.S. Pat. No. 5,126,742 describes an architecture of this type.

Finally, in an architecture recently proposed by the Applicant, there is a combined converter in which the same bridge of resistors is used both as a reference for a coarse converter and for fine interpolation (patent application No. FR 92 14640).

In most architectures of combined converters, it is necessary to see to it that the analog signal to be converted goes first of all into a sample-and-hold circuit. Indeed, the combined converters need a certain period of time to give a complete signal. And the input analog signal should not vary during this period, failing which it is possible that aberrant results might be obtained. For example, in certain architectures, the fine conversion can be done only after a phase of reconstruction of a remainder voltage on the basis of the result of a coarse conversion: the remainder should not vary during reconstruction. Similarly, in the architectures where the fine interpolation is done by series-connected circuits, the input voltage should not vary between the moment of the interpolation in the first stage and the moment of interpolation in the last stages.

A sample-and-hold circuit is therefore planned upline with respect to the converter. It receives an analog voltage Ve to be converted and gives, at its output, a sampled voltage Vin that is the value of Ve measured at the start of a conversion phase. This output voltage Vin is held with high precision throughout the time needed for the conversion, both coarse and fine.

This sampled and held voltage is therefore applied to the coarse converter and is used also by the fine converter.

However, the making of the sample-and-hold circuit is a delicate task. Its dynamic response speed and its precision must be high. It should be capable of sampling and holding an analog signal that varies at high speed with high amplitudes: it should therefore have good characteristics of dynamic linearity. Furthermore, it should be capable of controlling the fairly high input capacitance of the different input circuits of the converter: this capacitance results from the parallel-connection of all the input capacitances of the different amplifiers and comparators, which are sometimes very numerous and which may receive the input voltage Vin in parallel. However, the sample-and-hold circuit should not consume excessive power, the dissipation of power being one of the most important limitations in the making of the precision analog-digital converters.

All these constraints mean that the sample-and-hold circuit is a circuit element that is almost as difficult to make as the analog-digital converter at whose input it is placed.

An aim of the invention is to make the converter less dependent on the limitations of performance introduced by the sample-and-hold circuit.

SUMMARY OF THE INVENTION

To this end, the invention proposes an analog-digital converter comprising a coarse converter and a fine converter, at least one of the converters (in principle the fine converter) comprising several differential amplifiers, each receiving, firstly, an analog voltage to be converted and, secondly, a reference voltage, the particular feature of the invention being the fact that a sample-and-hold circuit is placed downline with respect to each of the differential amplifiers.

In the present application, the term "differential amplifier" is understood to mean an analog type circuit element giving an analog voltage that represents the difference between the voltage to be converted and a reference voltage and not a simple logic comparator switching over to one direction or to the other according to the sign of this difference. The term "sample-and-hold" circuit is consequently understood to mean a circuit element capable of sampling and holding a value of analog voltage and not just a logic flip-flop circuit capable of switching into a state at an instant defined by a clock and of remaining there up to a following clock stroke.

In other words, according to the invention, it is no longer attempted to hold the voltage to be converted upline. Rather, this is done by holding the levels of output analog voltage of several differential stages that work in parallel on the basis of this analog voltage. The general sample-and-hold circuit placed at the input of the converter is therefore eliminated.

The different sample-and-hold circuits distributed at output of the differential amplifiers no longer need to have performance characteristics that are as difficult to obtain as those of the prior art sample-and-hold circuit which was placed upline with respect to all the comparators and differential amplifiers of the two converters (fine and coarse). The total power consumption could therefore be greatly reduced.

Furthermore, the distributed sample-and-hold devices will directly receive differential voltages at output of the amplifiers, which is advantageous: the sample-and-hold circuits that work differentially indeed have greater precision than others (with higher common-mode rejection ratio, improved behaviour characteristics during holding operations). In the prior art, it was often necessary to begin by converting the input voltage into a differential voltage Ve before applying it to a differential sample-and-hold circuit.

It then becomes possible to carry out the sampling phase (simultaneously at output of all the differential amplifiers) exactly when the input voltage is converted by the other converter (in principle the coarse converter). There is then a first conversion result, often obtained simultaneously or almost simultaneously, coming from one of the converters, and the other converter will work, more slowly, on the fixed value that the input voltage had when it was converted by the first converter.

This is true especially when the coarse converter is a flash type converter comprising several comparators activated simultaneously to compare the analog voltage with voltage references during a phase of coarse conversion. In this case, it will advantageously be seen to it that the voltage references of the comparators and the voltage references of the differential amplifiers are defined by the intermediate tapping points of one and the same bridge of resistors.

Certain converter architectures are designed so as to have a large number of differential amplifiers upline with respect to a fine interpolation circuit for the obtaining of the least significant bits, but only three amplifiers, selected as a function of the result of the coarse conversion, are used for the fine conversion. If the sample-and-hold circuit is a single circuit, placed upline with respect to the amplifiers, it is charged with the totality of the input capacitances of these amplifiers even if they are not used. In the case of the invention, it is possible to envisage an operation where the only units made to work are the three sample-and-hold circuits placed at output of the three amplifiers that are actually used. The others will be inhibited and will not take part in the power dissipation of the whole system.

The invention can be applied to all sorts of architectures of combined converters, and notably to those mentioned here above, for example those in which the differential amplifiers are signal-folding amplifiers. In this case, the sample-and-hold circuits are placed at output of these signal folding amplifiers.

BRIEF DESCRIPTION OF THE DRAWINGS

Other features and advantages of the invention shall appear from the following detailed description, made with reference to the appended drawings, of which.

MORE DETAILED DESCRIPTION

Figure 1:
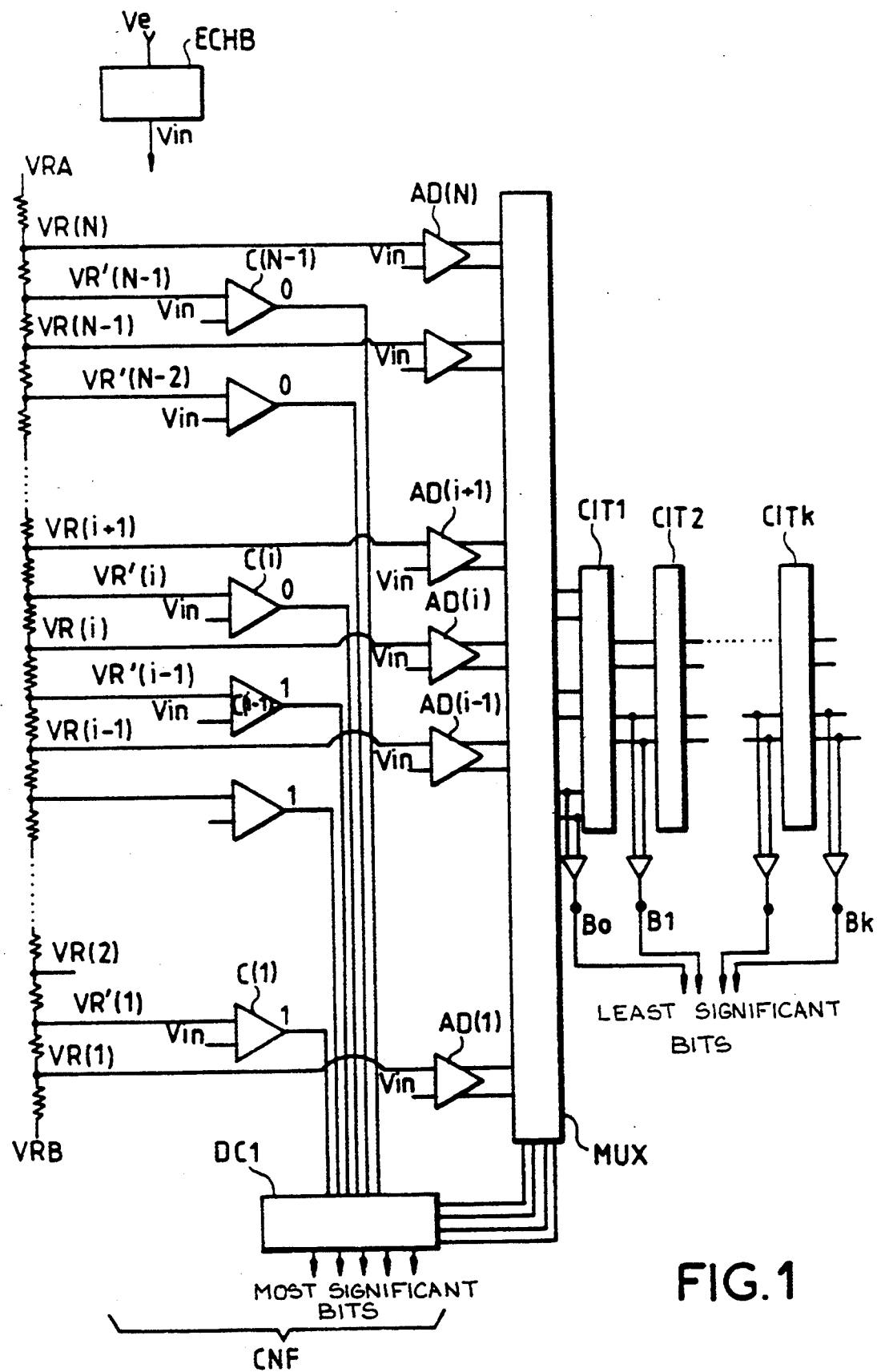
FIG. 1 shows an architecture of a combined converter proposed by the Applicant in the patent application FR 92 14 640.

The combined converter architecture shown in FIG. 1 relies on the following principles: the converter has a bridge of precision resistors supplied between two extreme reference voltages VRA and VRB. The intermediate tapping points of this bridge define, firstly, N first equidistant voltage references $VR(1)$, $VR(2)$ ... $VR(i)$ ... $VR(N)$ and, secondly, N−1 second references $VR'(1)$, $VR'(2)$, ... $VR'(i)$ ... $VR'(N-1)$ that are intermediate between the N first references and are preferably located in the middle of the successive intervals between the first references. N is equal to 32 if it is desired to have five most significant bits.

The N second references $VR'(1)$ to $VR'(N)$ are the voltage references of a flash analog-digital converter CNF which furthermore receives an analog input signal Vin. The flash converter is constituted by means of N−1 comparators $C(1)$ to $C(N-1)$ and a decoder DC1. The comparators give N logic outputs according to a code known as a "thermometrical" code, i.e. if Vin is included, for example, between $VR'(i-1)$ and $VR'(i)$, then the i−1 first comparators of the series give a logic output at a first level (1 for example) and all the following comparators give the complementary state (0). The decoder DC1 placed at output of the comparators $C(1)$ to $C(N-1)$ enable this code to be converted into a binary code representing the most significant bits of the digital value of the analog signal Vin.

The N first voltage references $VR(1)$ to $VR(N)$ are each applied to a first input of a respective differential amplifier $AD(1)$ to $AD(N)$ which receives the analog voltage vin at another input. The amplifiers are standard differential amplifiers. At their two outputs, they give two voltages that vary symmetrically and monotonically throughout the range of possible variation of the voltage Vin, these voltages taking a mean common value Vm when the difference between their input voltages gets nullified.

The input signal Vin applied to the input of the comparators and the differential amplifiers comes from a sample-and-hold circuit ECHB which receives the analog voltage to be converted Ve, samples it at the start of a conversion phase and holds it throughout this phase.

The logic signals coming from the flash converter, at output of the comparators $C(1)$ to $C(N-1)$ or at output of the decoder DC1, are used not only to give the most significant bits of the conversion but also to select three adjacent differential amplifiers $AD(i-1)$, $AD(i)$, $AD(i+1)$ whose voltage references $VR(i-1)$, $VR(i)$, $VR(i+1)$ are the closest to the coarse encoding value obtained for Vin.

If Vin is included between $VR'(i-1)$ and $VR'(i)$ (which are respectively located at mid-distance from $VR(i-1)$ and $VR(i)$ on the one hand and $VR(i)$ and $VR(i+1)$ on the other hand), then the three amplifiers $AD(i-1)$, $AD(i)$, $AD(i+1)$ which receive $VR(i-1)$, $VR(i)$, $VR(i+1)$ as input references are selected. The outputs of these three amplifiers are then connected by an analog multiplexer MUX to a first interpolation circuit CITI. The multiplexer is controlled by the outputs of the decoder DC1 or by the outputs of the comparators $C(1)$ to $C(N-1)$. The outputs of the other amplifiers are not used.

The first interpolation circuit gives four first-order differential interpolation voltages that are continuously variable as a function of Vin, varying inversely two by two. Two of these voltages pass through a mean value while, of the other two, one shows a maximum and the other a minimum when the voltage Vin is equal to any one of the three main reference voltages $VR(i-1)$, $VR(i)$, $VR(i+1)$.

The outputs of the circuit CIT1 are connected to a following interpolation circuit CIT2 which is itself connected to a third etc. There is therefore a cascade of k interpolation circuits CIT2, ... CITk (k=5 for example to obtain seven least significant bits). Each k order interpolation circuit receives four voltages from a k−1 order interpolation circuit and gives four k order interpolation voltages that are variable as a function of the amplitude of the signal Vin to be converted. The four k order interpolation voltages vary inversely, two by two. Two of them pass through a common mean value when the voltage Vin to be converted is equal to values known as "k order intermediate voltages", and one of them touches a maximum and the other a minimum when the voltage Vin to be converted is equal to the first-order or k−1 order main or intermediate reference voltages. The other two k order interpolation voltages go through a common mean value when the voltage Vin is equal to a first to k−1 order main or intermediate reference voltage.

Comparators CMP0 to CMPk, placed at the input or output of the interpolation circuits CIT1 to CITk give the least significant bits B0 to Bk of the fine conversion.

Consequently, the flash converter CNF, constituted by means of the comparators $C(1)$ to $C(N-1)$, gives a numerical value representing the position of Vin with reference to the voltage references $VR'(1)$ to $VR'(N-1)$ and this converter therefore indicates a triplet of values $VR(i-1)$, $VR(i)$, $VR(i+1)$ between which Vin is located. The converter with successive interpolations CIT1, CIT2, ... CITk, gives the more precise position of Vin within this triplet in digital form.

The least significant bits and the most significant bits are added together in an adder (not shown) to arrive at a total digital value of Vin.

It will be observed that the same bridge of resistors is used for the coarse conversion (most significant bits) of Vin and for the fine conversion (least significant bits) of the remainder.

In the architecture shown in FIG. 1, there is provision for N amplifiers $AD(1)$ to $AD(N)$, the outputs of which are connected to the 2N inputs of a multiplexer which can transmit three pairs of signals to the circuit CIT1. However, it would have been possible also to design the multiplexer so as to give it N inputs and three outputs and place it immediately at output of the bridge of resistors, to select three reference voltages VR(i−1), VR(i), VR(i+1) and transmit them to the input of three amplifiers ADC, ADB, ADA. In this case, there are not N amplifiers out of which three are chosen but only three amplifiers receiving three reference voltages selected from among N. This implies, however, that the multiplexer is capable of transmitting the selected reference voltages at its output without downgrading them.

According to the invention, it is proposed, in the general case where the analog voltage is thus applied to the input of differential amplifiers, to place sample-and-hold circuits at the output of these amplifiers and to eliminate the sample-and-hold circuit ECHB.

Figure 2:
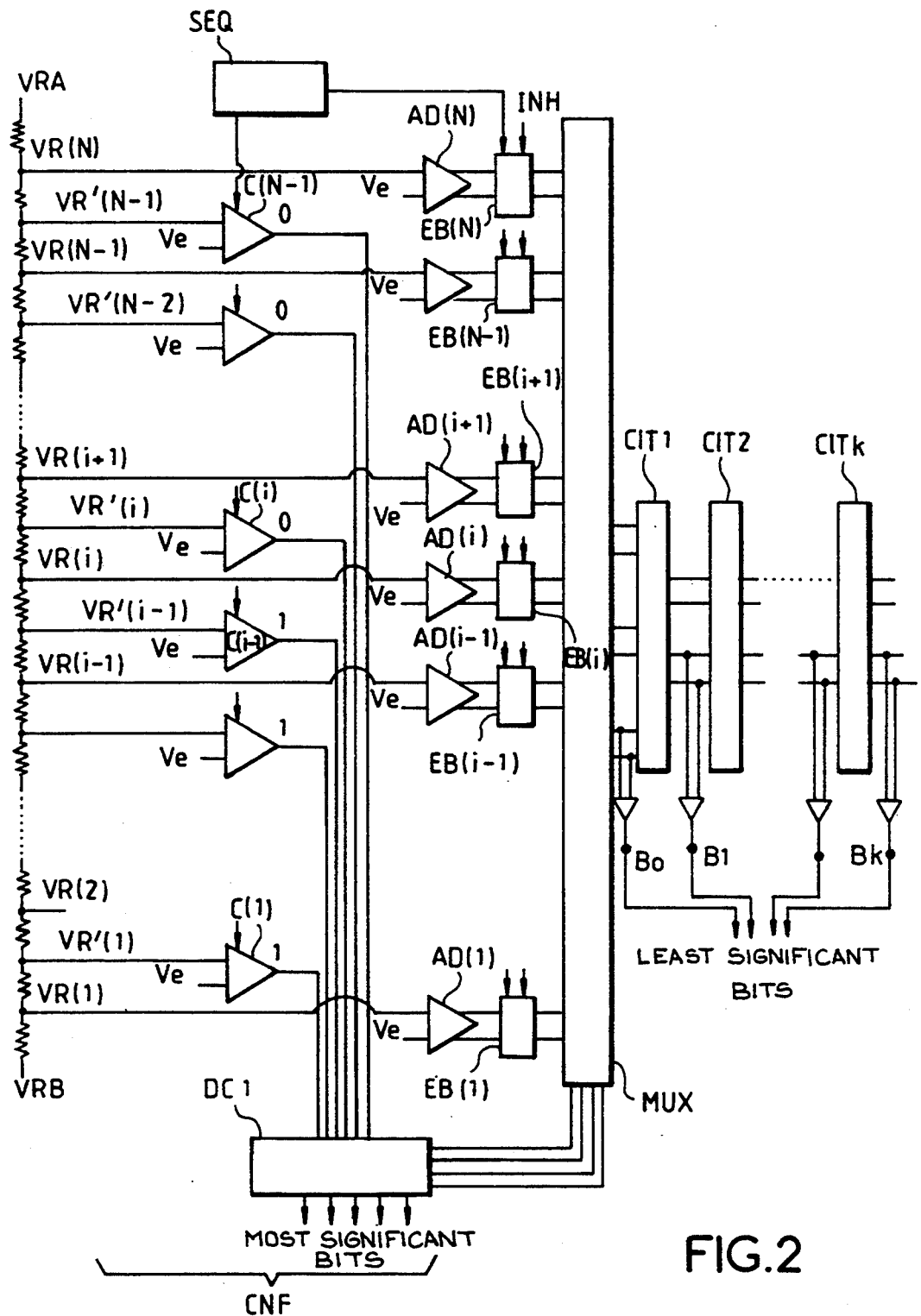
FIG. 2 shows a general exemplary architecture of a converter according to the invention.

FIG. 2 shows the corresponding embodiment when the starting point for the structure is the converter of FIG. 1. However, diagrams can be prepared similarly, on the basis of other architectures.

Sample-and-hold circuits EB1, ... EB(i−1), EB(i), EB(i+1), ... EB(N) are placed respectively at output of the amplifiers AD1, ... AD(i−1), AD(i), AD(i+1), ... AD(N).

These sample-and-hold circuits are circuits with a differential structure. They have to command low capacitive charges, unlike the sample-and-hold circuit of FIG. 1. They therefore do not need to have a structure with high current consumption.

The samplers EB1 to EB(N) are activated in phase with the conversion command of the coarse converter CNF, so that the sampled voltage at a given moment at the output of the differential amplifiers is the one that corresponds to the input voltage value Ve for which the coarse converter gives the most significant bits of the conversion.

In MOS technology, the comparators C(1) to C(N−1) of the coarse converter may be switched-capacitance comparators working in two phases: firstly, a precharging phase for the storage of a voltage in an input capacitor; in this phase, the comparator is looped with a unit gain, and a reference voltage VR'(i), corrected by the input offset voltage of the comparator, is stored in the capacitor; and secondly a conversion phase in which the analog voltage Ve is effectively applied to the comparator to make it switch over to one direction or the other. It is the instant of this second phase that must be synchronized with the sampling instant of the sample-and-hold circuits EB(1) to EB(N). This is shown symbolically by a sequencing circuit SEQ that controls both the comparators and the sample-and-hold circuits.

In bipolar technology, the comparators are rather differential amplifiers followed by a storage flip-flop circuit; they thus work in two phases: comparison and then storage, and it is a storage phase that must be synchronized with the instant of sampling.

The sample-and-hold circuits are then turned off up to the end of the fine conversion phase.

It is possible, as the case may be, to design an system where the sample-and-hold circuits may be inhibited by a specific command INH. In this case, the outputs of the decoder DC1 may be used to inhibit the samplers other than those at the output of the amplifiers AD(i−1), AD(i), AD(i+1) whose outputs are selected by the multiplexer MUX. The inhibited samplers do not consume any power during the sampling phase, and this contributes to limiting the total power consumption of the converter.

The invention can be applied to other general configurations of converters than the one shown in FIG. 2. For example, the multiplexer MUX could be connected to a parallel (and not a series) interpolation circuit comprising bridges of resistors placed between the outputs of the multiplexer, with comparators to compare the voltage levels at the intermediate tapping points of these bridges.

The invention can be applied also when the fine converter comprises, at output of the main bridge of resistors, not N ordinary differential amplifiers receiving the voltage Ve to be converted but two signal folding circuits giving voltages that vary periodically and in phase quadrature as a function of the input voltage Ve that is applied to them.

What is claimed is:

1. An analog-digital converter comprising a coarse converter and a fine converter, one of the converters comprising several differential amplifiers each receiving, firstly, an analog voltage to be converted (Ve) and, secondly, a reference voltage, wherein a sample-and-hold circuit is placed downline with respect to each of the differential amplifiers.

2. A converter according to claim 1, wherein the sample-and-hold circuits are activated in synchronism with the conversion by the another one of said connecters.

3. A converter according to claim 1, wherein the converter comprising input differential amplifiers is the fine converter.

4. A converter according to claim 3, wherein the coarse converter is a flash type converter comprising several comparators activated simultaneously to compare the analog voltage with voltage references during a coarse conversion phase.

5. A converter according to claim 4, wherein the voltage references of the comparators and the voltage references of the differential amplifiers are defined by the intermediate tapping points of a one and the same bridge of resistors.

6. A converter according to any one of the claims 4 or 5, wherein the coarse converter works in a precharging phase and a conversion phase, and wherein the conversion phase is carried out simultaneously with a phase for the sampling of the sample-and-hold circuits.

7. A converter according to any of claims 1-5, wherein the fine converter has a bridge of resistors defining reference voltages and differential amplifiers connected to this bridge of receivers and receiving, furthermore, a voltage (Ve) to be converted, means to select three differential amplifiers as a function of a coarse conversion result given by the coarse converter and a fine interpolation circuit downline with respect to these amplifiers, sample-and-hold circuits being placed between the selected differential amplifiers and the fine interpolation circuit.

8. A converter according to claim 7, wherein the sample-and-hold circuits are placed downline with respect to all the differential amplifiers and wherein there are provided means to inhibit the sample-and-hold circuits connected to the non-selected differential amplifiers.

9. A converter according to any of the claims 1 to 5, wherein the fine converter has a bridge of resistors and signal-folding differential amplifiers receiving, firstly, reference voltages defined by this bridge and, secondly, the analog voltage to be converted and wherein the sample-and-hold circuits are connected to the outputs of the signal-folding amplifiers.

* * * * *